United States Patent [19]

Kamisawa

[11] Patent Number: 5,271,797

[45] Date of Patent: Dec. 21, 1993

[54] METHOD FOR PATTERNING METAL OXIDE THIN FILM

[75] Inventor: Akira Kamisawa, Kyoto, Japan

[73] Assignee: Rohm Co., Ltd., Kyoto, Japan

[21] Appl. No.: 925,052

[22] Filed: Aug. 5, 1992

[30] Foreign Application Priority Data

Oct. 28, 1991 [JP] Japan .................................. 3-281627

[51] Int. Cl.$^5$ ............................ B44C 1/22; C23F 1/00
[52] U.S. Cl. .................................. 156/635; 156/643;
156/656; 156/667; 252/79.2; 252/79.3;
252/79.4
[58] Field of Search ............... 156/635, 643, 654, 655,
156/656, 659.1, 662, 663, 667; 252/79.1, 79.2,
79.3, 79.4

[56] References Cited

U.S. PATENT DOCUMENTS 4,838,989  6/1989  Ashby et al. ................... 156/635 X
4,874,462 10/1989  Makita et al. ...................... 156/635

Primary Examiner—William A. Powell
Attorney, Agent, or Firm—Nikaido, Marmelstein, Murray & Oram

[57] ABSTRACT

A method for patterning a metal oxide thin film comprising the steps of: (1) preparing a mixture solution containing alkoxide or alkoxyalcoholate and alcohol or alkoxyalcohol, (2) mixing an acid-generating agent with the mixture solution, (3) applying the mixture solution to a substrate to form a thin film and drying the thin film, (4) selectively irradiating the thin film formed on the substrate to accelerate the gelation, (5) removing the non-irradiated thin film, and (6) burning the remaining thin film. According to the present invention, a metal oxide thin film is formed by sol-gel method, and thereto is mixed an acid-generating agent, so that etching by irradiating can be applied to a precursor thin film not sintered. Thanks to this, a metal oxide thin film can be easily patterned with a fine processing.

9 Claims, No Drawings

METHOD FOR PATTERNING METAL OXIDE THIN FILM

BACKGROUND OF THE INVENTION

The present invention relates to a method for patterning a metal oxide thin film. More particularly, the present invention relates to a method for patterning a metal oxide thin film such as a ferroelectric film and an ITO film with accuracy of submicron order. The ferroelectric film is used in a storage cell or the like, and the ITO film is used in a liquid crystal display element or the like.

There are many kinds of metal oxide having various characteristic, such as, a high dielectric constant and consequent significant hysterisis of dielectric polarization, significant piezoelectric effect, significant pyroelectric effect, significant electro-optic effect, superconductivity or the like. The metal oxide has been utilized in every kinds of electronic parts such as a semiconductor storage cell, a piezoelectric element, a pyroelectric element, an electro-optic element, a liquid crystal display, an electroluminescent element, a photoelectric cell or the like.

Formation of a thin film of the metal oxide is carried out in a manner that the metal oxide is deposited on a substrate to form a film by sputtering (DC, RF, RF magnetron), evaporation, MOCVD (Metal Organic Chemical Vapor Deposition) or the like, thereafter the deposited film is burned to be crystalized. In that case, the deposition of film can be carried out under heating instead of separate deposition and burning steps. Fine processing of the thin film is carried out in a manner that a resist desirably patterned by lithography is applied on the thin film, thereafter there is performed wet etching with etchant of acid solution, physical dry etching with ion milling or plasma etching with HCl or $CF_4$.

As another method for forming the metal oxide film, there is also employed a method wherein solution prepared by sol-gel method or MOD (Metal Organic Decomposition) method is applied by spin coating or dip coating on a substrate to form a film, and this film is burned to be crystalized. The film formation by the sol-gel method is disclosed for example in Japanese Unexamined Patent Publications No. 310969/1988, No. 108161/1989, No. 286922/1989, No. 287278/1989, No. 294522/1989 and No. 6335/1990. Fine processing of the metal oxide thin film formed by the disclosed methods is carried out, similar to the above, by wet etching, dry etching or plasma etching.

When the metal oxide thin film is burned (i.e. subjected to thermal treatment), a dense film is formed thereon so that the metal oxide thin film shows the above-mentioned characteristics. However, once the film is burned, it becomes very hard and therefore processing thereof becomes difficult. On the other hand, with recent tendency to much highly integrate electronic parts, for example semiconductor storage device wherein memory cell is integrated requires a fine processing with accuracy of submicron order not higher than 0.5 μm.

If the patterning of the metal oxide thin film is carried out with conventional wet etching, a part to be left is narrowed by undercut because of isotropy of wet etching. Further the resist peels off under significant damage by strong acid or strong alkali and this causes deformation or losing of the pattern. This make it impossible to finely pattern with accuracy of submicron order. Thus, wet etching has some disadvantages.

Dry etching, for example ion milling, is good at finely patterning because dry etching is performed with ion (for example argon ion) beam. However, dry etching has disadvantages that it gives damage to an active lower substrate and it does not realize high "selective ratio". The "selective ratio" means a ratio of etching rates of the active substrate and the resist.

With respect to plasma etching, there is a problem that the etching rate is low and it is not suitable for mass production.

The present invention was made in view of the above-mentioned problems, and an object of the present invention is to provide a method for easily and finely processing a metal oxide thin film. By the method of the present invention, metal oxide thin film can be easily applied to highly integrated electronic parts such as a semiconductor storage device.

SUMMARY OF THE INVENTION

According to the present invention, there is provided a method for patterning a metal oxide thin film comprising the steps of:

(1) preparing a mixture solution containing at least one alkoxide and/or alkoxyalcoholate of an element selected from the following Group A and at least one alcohol and/or alkoxyalcohol selected from the following Group B:

Group A: lithium, beryllium, boron, sodium, aluminium, potassium, calcium, scandium, titanium, vanadium, chromium, manganese, iron, cobalt, nickel, copper, zinc, gallium, germanium, arsenic, selenium, rubidium, strontium, zirconium, niobium, rhodium, palladium, cadmium, indium, tin, antimony, tellurium, cesium, barium, lanthanum, cerium, praseodymium, neodymium, europium, gadolinium, terbium, holmium, ytterbium, ruthenium, hafnium, tantalum, platinum, lead, bismuth, and thorium, Group B: methanol, ethanol, propanol, butanol, methoxyethanol, ethoxyethanol, propoxyethanol, and butoxyethanol;

(2) mixing an acid-generating agent which generates an acid under light, laser beams, electron beams or X-rays with the mixture solution;

(3) applying the mixture solution to a substrate to form a thin film, and drying the thin film;

(4) selectively irradiating the thin film formed on the substrate with light, laser beams, electron beams or X-rays to accelerate the gelation;

(5) removing the non-irradiated thin film in the step (4) by etching; and (6) burning the remaining thin film in the step (5).

If the alkoxide or alkoxyalcoholate is one of those in the following Group C and the alcohol or alkoxyalcohol is one of those in the following Group D, a patterned titania thin film can be formed.

Group C: titanium methoxide, titanium ethoxide, titanium propoxide, titanium butoxide, titanium methoxyethoxide, and titanium ethoxyethoxide Group D: methanol, ethanol, propanol, butanol, methoxyethanol, and ethoxyethanol In the step (1), if there is prepared a mixture solution containing at least one compound selected from the following Group E, at least one compound selected from the following Group C, and at least one compound selected from the following Group D, a patterned barium titanate thin film can be formed.

Group E: barium methoxide, barium ethoxide, barium propoxide, barium butoxide, barium methoxyethoxide, and barium ethoxyethoxide Group C: titanium methoxide, titanium ethoxide, titanium propoxide, titanium butoxide, titanium methoxyethoxide, and titanium ethoxiethoxide Group D: methanol, ethanol, propanol, butanol, methoxyethanol, and ethoxyethanol In the step (1), if there is prepared a mixture solution containing at least one compound selected from the following Group F, at least one compound selected from the following Group G, and at least one compound selected from the following Group D, a patterned lead titanate thin film can be formed.

Group F: lead methoxide, lead ethoxide, lead propoxide, and lead butoxide

Group G: titanium methoxide, titanium ethoxide, titanium propoxide, and titanium butoxide Group D: methoanol, ethanol, propanol, butanol, methoxyethanol, and ethoxyethanol In the step (1), if the mixture solution further contains at least one alkoxide and/or alkoxyalcoholate of an element selected from the following Group H, a patterned ferroelectric thin film can be formed.

Group H: lanthanum, niobium, zirconium, iron, and manganese

In the step (1), if the mixture solution further contains at least one compound selected from the following Group I, a patterend lead titanate zirconate thin film can be formed.

Group I: zirconium methoxide, zirconium ethoxide, zirconium propoxide, and zirconium butoxide In the step (1), if there is prepared a mixture solution containing at least one compound selected from the following Group J, at least one compound selected from the following Group K, and at least one compound selected from the following Group D, a patterned ITO thin film can be formed.

Group J: indium methoxide, indium ethoxide, indium propoxide, indium butoxide, indium methoxyethoxide, and indium ethoxyethoxide Group K: tin methoxide, tin ethoxide, tin propoxide, tin butoxide, tin methoxyethoxide, and tin ethoxyethoxide Group D: methanol, ethanol, propanol, butanol, methoxyethanol, and ethoxyethanol In the step (1), if there is prepared a mixture solution containing at least one compound selected from the following Group L, at least one compound selected from the following Group M, and at least one compound selected from the following Group D, a lithium-containing composite oxide thin film can be formed.

Group L: niobium methoxide, niobium ethoxide, niobium propoxide, niobium butoxide, niobium methoxyethoxide, and niobium ethoxyethoxide Group M: lithium methoxide, lithium ethoxide, lithium propoxide, lithium butoxide, lithium methoxyethoxide, and lithium ethoxyethoxide Group D: methanol, ethanol, propanol, butanol, methoxyethanol, and ethoxyethanol In the step (1), if there is prepared a mixture solution containing at least one alkoxide or alkoxyalcoholate of an element selected from the following Group N, at least one compound selected from the following Group M, and at least one compound selected from the following Group D, a lithium-containing composite oxide thin film can be also formed.

Group N: niobium, tantalum, manganese, and iron

Group M: lithium methoxide, lithium ethoxide, lithium propoxide, lithium butoxide, lithium methoxyethoxide, and lithium ethoxyethoxide Group D: methanol, ethanol, propanol, butanol, methoxyethanol, and ethoxyethanol According to the present invention, a mixture solution containing alkoxide and/or alkoxyalcoholate of metal element and alcohol and/or alkoxyalcohol is prepared, and to the solated solution thereof an acid-generating agent is added and mixed. The resulting mixture solution is applied on a substrate and is dried to form a thin film. For this reason, by irradiating light, laser beams, electron beams, X-rays or the like through an aligner, the thin film is selectively irradiated and an acid is generated in the irradiated area. The catalysis of this acid accelerates hydrolysis and polycondensation reaction.

As a result, contrast of polycondensation is caused between the exposed solated film and the non-exposed solated film, and this brings contrast of dissolution rates under a developer, whereby the thin film can be patterned. Thereafter the patterned thin film is subjected to heat treatment and is sintered so that the patterned thin film is completed.

According to the present invention, the solated thin film is directly irradiated with light or the like through an aligner and the thin film other than desired x can be removed by etching, so that a predetermined formation of resist pattern can be omitted unlike in conventional methods and a patterned thin film can be directly formed.

DETAILED DESCRIPTION

Hereinafter the present invention is explained in detail.

There is prepared a mixed solution containing one or more alkoxides and/or alkoxyalcoholates of a metal element, and one or more alcohols and/or alkoxyalcohols. The term "metal element" used herein means an inorganic element capable of binding to an organic substance. Examples of the metal element are, for instance, lithium, beryllium, boron, sodium, aluminium, potassium, calcium, scandium, titanium, vanadium, chromium, manganese, iron, cobalt, nickel, copper, zinc, gallium, germanium, arsenic, selenium, rubidium, strontium, zirconium, niobium, rhodium, palladium, cadmium, indium, tin, antimony, tellurium, cesium, barium, lanthanum, cerium, praseodymium, neodymium, europium, gadolinium, terbium, holmium, ytterbium, ruthenium, hafnium, tantalum, platinum, lead, bismuth, thorium or the like.

Alkoxide or alkoxyalcoholate of metal element means a compound wherein hydrogen of alcoholic hydroxy group alcohols is substituted with the metal element. Therefore, methoxide, ethoxide, propoxide, butoxide or the like can be used. The propoxide may be either 1-propoxide or 2-propoxide. The butoxide may be any of 1-butoxide, 2-butoxide, isobutoxide and t-butoxide.

As an alcohol, there can be used methanol, ethanol, propanol, butanol or the like. The propanol might be either 1-propanol or 2-propanol. The butanol might be any of 1-butanol, 2-butanol, isobutanol, t-butanol. Further, as an alkoxyalcohol, there can be used methoxyethanol, ethoxyethanol, propoxyethanol, butoxyethanol or the like.

Such alcohol or alkoxyalcohol is used as solvent. Although an alkoxide-to-alcohol (or alkoxide-to-alkoxyalcohol) mixing ratio somewhat varies depending on mixed materials, the ratio is about 0.01 to 0.5 by weight. The mixing ratio of alkoxyalcoholate to alcohol or alkoxyalcohol is the same as in the case of alkoxide.

With thus obtained mixture in the above step is mixed an acid-generating agent which generates an acid when irradiated with light, laser beams, electron beams, X-rays or the like.

As such acid generating agent, there can be used, for instance, an onium salt, a nitrobenzyl ester, a sulfonic ester or the like. In the case that a mixing ratio of the acid-generating agent to the mixture is within a range of 0.001 to 0.3 by weight, selective exposure and etching can be carried out.

Then a thin film is formed by applying the mixed solution to a substrate on which a thin film is to be formed, and the formed film is dried. Such thin film formation is carried out as follows. That is, the mixed solution is applied to the substrate in a predetermined thickness by spin coating or the like, and then heat treatment at 30° to 80° C. for 1 to 60 minutes is performed to dry the substrate. As a result, there can be formed a precursor thin film, a metal oxide film not sintered.

The precursor thin film is irradiated with light, laser beams, electron beams, X-rays or the like through an aligner to selectively accelerate the gelation of the thin film, and then the thin film is selectively etched. The aligner is so prepared that only positions where a metal oxide thin film is to be formed is exposed by light or the like transmitted therethrough and the other positions are not exposed by light or the like. In the portion exposed with the light or the like, the acid-generating agent mixed in the above mentioned step is decomposed with energy of light or the like to generate an acid, and the catalysis of this acid accelerates hydrolysis and polycondensation reaction. As a result, gelation of the irradiated portion of the thin film with light or the like is accelerated and this portion becomes strong against a processing liquid. When applying a developer such as an organic solvent, an acid and an alkali, only the non-exposed portion can be removed. Thus, patterning of the metal oxide thin film can be carried out as desired. When selectively irradiating light or the like to a thin film through the aligner, the use of strong directional laser beams, electron beams, X-rays or the like enables fine processing of a thin film with accuracy of submicron order. An etchant to be used is selected depending on thin film materials, for example, there can be used a mixture of hydrogen fluoride and hydrochloric acid, an alcohol solvent or the like.

Thereafter, the remaining gelated thin film is burned to realize a desired patterned thin film. This burning is carried out under a condition as follows. That is, firstly heat treatment at 300° to 400° C. for 30 to 60 minutes is performed, and then following heat treatment at 500° to 800° C. for 60 to 180 minutes is performed. Thereby a strong dense thin film can be formed. The condition of the following heat treatment might vary depending on metal oxide materials.

The present invention is more specifically described and explained by means of the following Examples in which all percents are by weight unless otherwise noted. It is to be understood that the present invention is not limited to the Examples, and various changes and modifications might be made in the invention without departing from the spirit and scope thereof.

EXAMPLE 1

In an atmosphere of dry nitrogen, 0.005 mol of ethoxide of barium (Ba) and 0.005 mol of methoxide of titanium (Ti) were measured out. Thereto was added 0.01 mol of monoethanolamine. Then, 100 ml of ethanol was added thereto and mixed with stirring for 6 hours to prepare a transparent solution. Successively, as an acid-generating agent, 5% benzene diazonium salt ($C_6H_5—N_2{}^+PF_6{}^-$) was added to the solution and mixed with stirring. Herein the used monoethanolamine is not necessarily indispensable because it inhibits sol-gel reaction, i.e. hydrolysis and polycondensation reaction.

The resulting solution was applied by spin coating to a platinum metal film formed on a silicon semiconductor substrate with a silicon dioxid film being located therebetween. Then, the substrate was treated at 80° C. for 30 minutes to dry. Successively, the substrate was irradiated with far ultraviolet rays through an aligner to draw a pattern.

The semiconductor substrate was developed with a 1% aqueous solution containing hydrogen fluoride (HF) and nitric acid ($HNO_3$) in 1:1 ratio to remove the unexposed film so that an aligner-patterned thin film was prepared.

Then, the semiconductor substrate was subjected to heat treatments at 80° C. for 1 hour, 300° C. for 1 hour, and 600° C. for 1 hour to complete a patterned thin film of barium titanate ($BaTiO_3$) on the substrate.

Example 1 is based on ethoxide of barium and methoxide of titanium. However, the present invention is not limited to use these alkoxides. Each of the alkoxides can be substituted with methoxide, ethoxide, propoxide, butoxide, methoxyethoxide or ethoxyethoxide to similarly form a patterned thin film. In case of using propoxide, either 1-propoxide or 2-propoxide might be used. In case of using butoxide, any of 1-butoxide, 2-butoxide, isobutoxide and t-butoxide might be used.

Ethanol was used as solvent. However, other alcohol such as methanol, propanol, butanol, methoxyethanol and ethoxyethanol can be used to similarly form a patterned thin film. In case of using propanol, either 1-propanol or 2-propanol might be used. In case of using butanol, any of 1-butanol, 2-butanol, isobutanol and t-butanol might be used.

In Example 1, the benzenediazonium salt was used as an acid-generating agent. However, an onium salt other than the used salt such as a diphenyliodonium salt or a triphenyl sulfonium salt, other nitrobenzyl ester or sulfonic ester, or the like can be used. The mixing ratio of the benzenediazonium salt to the solution was 5%. However, the mixing ratio might be within the range from 0.1 to 30%, although the mixing ratio varies depending on a used acid-generating agent.

In Example 1, far ultraviolet rays were used for exposure to form a pattern. Instead of far ultraviolet rays, electron beams, laser beams, X-rays and the like can be used.

The above-mentioned conditions of heat treatment, mixing ratio, etchant and the like are merely concrete examples and they are not limited to such ones.

Thus formed thin film of barium titantate is used as materials for electronics such as capacitor, a vibrator, a filter and a delay circuit. The thin film on a semiconductor substrate can be easily patterned, as described above, so that the thin film can be integrated with a semiconductor element or the like, and thereby realizing a higher performance and small-sized electronic equipment.

EXAMPLE 2

Lead 1-butoxide, zirconium 1-butoxide and titanium 1-butoxide were mixed in a mole ratio of 1:0.58:0.42. Thereto was added a 20-fold amount by weight of 2-methoxyethanol, and then mixed with stirring for 6 hours.

To the solution was added a mixture of 2-methoxyethanol and water (a 30 mol % aqueous solution of 2-methoxyethanol) and the resulting mixture is solated. As an acid-generating agent, 5% benzenediazonium salt ($C_6H_5$—$N_2{}^+PF_6{}^-$) was added thereto and mixed.

The resulting solution was applied by spin coating to a position of a semiconductor substrate where a capacitor of a semiconductor storage cell is to be formed. The substrate was subjected to heat treatment at 80° C. for 20 minutes to form a precursor thin film thereon. Thereafter a pattern was drawn by irradiating with far ultraviolet rays through an aligner. This aligner is so formed that light passing therethrough irradiates only a position where a capacitor is to be formed.

Then the semiconductor substrate was etched with an etchant obtained by mixing hydrochloric acid, hydrogen fluoride and water in 1:1:1 ratio to remove unnecessary unexposed film. Then, an aligner-patterned thin film was formed.

Thereafter, the semiconductor substrate was subjected to heat treatment at 400° C. for 1 hour and then 650° C. for 1 hour to form a ferroelectric film of $PbTiO_3$ at a predetermined position on the substrate. A semiconductor storage cell employing the ferroelectric film can be easily completed by carrying out processes for semiconductor device such as formation of an upper film electrode.

Example 2 is based on 1-butoxide of lead, 1-butoxide of zirconium and 1-butoxide of titanium. However, the present invention is not limited to use these alkoxides. Each of the alkoxides can be substituted with methoxide, ethoxide, propoxide, butoxide, methoxyethoxide or ethoxyethoxide to similarly form a patterned thin film. In case of using propoxide, either 1-propoxide or 2-propoxide might be used. In case of using butoxide, any of 2-butoxide, isobutoxide and t-butoxide might also be used other than 1-butoxide.

2-methoxy ethanol was used as solvent. However, other alcohol such as methanol, ethanol, propanol, butanol, methoxyethanol or ethoxyethanol can be used to similarly form a patterned thin film. In case of using propanol, either 1-propanol or 2-propanol might be used. In case of using butanol, any of 1-butanol, 2-butanol, isobutanol and t-butanol might be used.

In Example 2, benzene diazonium salt was used as an acid-generating agent. However, an onium salt other than the used salt such as a diphenyliodonium salt or a triphenyl sulfonium salt, other nitrobenzyl ester or sulfonic ester, or the like can be used. The mixing ratio of the benzenediazonium salt was 5%. However, the mixing ratio might be within the range from 0.1 to 30%, although the ratio varies depending on a used acid-generating agent.

In Example 2, far ultraviolet rays were used for exposure to form a pattern. Instead of far ultraviolet rays, electron beams, laser beams, X-rays and the like can be used.

The above-mentioned conditions of heat treatment, mixing ratio etchant and the like are merely concrete examples and they are not limited to such ones.

In Example 2, the alkoxide of zirconium and the alkoxide of titanium were mixed so that the total amount thereof corresponds to the amount of the alkoxide of lead. When the alkoxide of lead is mixed with the alkoxide of titanium in 1:1 ratio without mixing the alkoxide of zirconium and then the same process is repeated, a ferroelectric film of $PbTiO_3$ (PT) can be obtained. The mixing of the alkoxide of zirconium therewith brings $PbZr_{1-y}Ti_yO_3$ (PZT) and improved ferroelectricity of the film.

In the first mixing step in Example 2, if an alkoxide of lanthanum (La) is further mixed with the alkoxide of lead so as to bring a total ratio 1 in the mixing ratio and the same process is repeated, a ferroelectric film of $Pb_xLa_{1-x}Zr_{1-y}Ti_yO_3$ (PLZT) can be obtained. The adding of the alkoxide of La enables improvement of property of the ferroelectric film.

Niobium (Nb), manganese (Mn), iron (Fe) or the like, or a mixture of at least two of them can replace the lanthanum. Lanthanum, niobium or the like, or a mixture of at least two of them can replace the zirconium. Thus, a patterned ferroelectric thin film of which basic structure is $PbTiO_3$ can be obtained.

These ferroelectric film can be used in a capacitor of a semiconductor storage cell, various ferroelectric sensor, a liquid crystal device, photodevice or the like. The ferroelectric film can be finely processed according to the present invention, so that the patterned thin film can be integrated with other elements, and also can be used as high performance and high quality elements.

EXAMPLE 3

In an atmosphere of dry nitrogen were mixed 0.018 mol of t-butoxide of indium (In), 0.02 mol of t-butoxide of tin (Sn) and 0.02 mol of diethanolamine which inhibits hydrolysis and polycondensation reaction. Then, 100 ml of ethanol was added thereto and mixed with stirring for at least 1 hour to prepare a transparent mixture solution. Successively, as an acid-generating agent 5% benzenediazonium salt ($C_6H_5$—$N_2{}^+PF_6{}^-$) was added to the solution and mixed with stirring.

The resulting solution was applied by spin coating to a quartz substrate. Then, the substrate was subjected to dry treatment at 80° C. for 30 minutes. Successively, the substrate was irradiated with far ultraviolet rays through an aligner to draw a pattern.

The selectively exposed thin film on the quartz substrate is developed with an etchant to form a patterned ITO (Indium Tin Oxide) film. The etchant used here is one obtained by diluting an aqua regia (conc.HCl: conc.$HNO_3$=3:1) with a 20 fold amount of pure water.

The quartz substrate on which the patterned ITO film was formed was dried at 80° C. for 1 hour, and then heated at 650° C. for 1 hour to remove remaining organic substance, so that the patterned film was completed.

Example 3 is based on t-butoxide of indium and t-butoxide of tin. However, the present invention is not limited to use these alkoxides. Each of the alkoxides can be substituted with methoxide, ethoxide, propoxide, butoxide, methoxyethoxide or ethoxyethoxide to similarly form a patterned thin film. In case of using propoxide, either 1-propoxide or 2-propoxide might be used. In case of using butoxide, any of 1-butoxide, 2-butoxide, and isobutoxide might be also used other than t-butoxide.

Ethanol was used as solvent. However, other alcohol such as methanol, propanol, butanol, methoxyethanol or ethoxyethanol can be used to similarly form a patterned thin film. In case of using propanol, either 1-propanol or 2-propanol might be used. In case of using butanol, any of 1-butanol, 2-butanol, isobutanol and t-butanol might be used.

In Example 3, the benzenediazonium salt was used as an acid-generating agent. However, an onium salt other than the used salt such as a diphenyliodonium salt or a triphenyl sulfonium salt, other nitrobenzyl ester or sulfonic ester, or the like can be used. The mixing ratio of the benzenediazonium salt was 5%. However, the mixing ratio might be within the range from 0.1 to 30%, although the ratio varies depending on an used acid-generating agent.

In Example 3, far ultraviolet rays were used for exposure to form a pattern. Instead of far ultraviolet rays, electron beams, laser beams, X-rays and the like can be used.

The above-mentioned conditions of heat treatment, mixing ratio, etchant and the like are merely concrete examples and they are not limited to such ones.

Thus formed ITO thin film comprising a solid solution of a small quantity of solid tin (Sn) and $In_2O_3$ has electrical conductivity. The ITO thin film can be utilized as an electrode of display elements such as a liquid crystal display element and an electroluminescent display element, and as an electrode of photosensitive elements such as a photocell and a camera tube. Further, the ITO thin film can be utilized as resistance of defogging and anti-icing window glass for cars, aircrafts, building structures and the like. This ITO film can be easily patterned as desired according to the present invention.

EXAMPLE 4

In an atmosphere of dry nitrogen were mixed 0.01 mol of ethoxide of niobium (Nb) and 0.01 mol of ethoxide of lithium (Li) and 0.02 mol of monoethanolamine which inhibits hydrolysis and polycondensation reaction. Then, 100 ml of ethanol was added thereto and mixed with stirring for 30 minutes by means of a stirrer to prepare a transparent mixture solution. Successively, as an acid-generating agent 5% benzenediazonium salt ($C_6H_5$—$N_2^+PF_6^-$) was added to the solution and mixed with stirring.

The resulting solution was applied by spin coating to a platinum metal film formed on a silicon semiconductor substrate with a silicon dioxide film being located therebetween. Then, the substrate was treated to dry at 80° C. for 30 minutes. Successively, the substrate was irradiated with far ultraviolet rays through an aligner to draw a pattern.

A pattern of $LiNbO_3$ thin film was prepared by developing the semiconductor substrate with a mixed acid of hydrogen fluoride (HF), nitric acid ($HNO_3$) and oxalic acid (($COOH)_2$) in 1:1:1 ratio.

Thereafter, the semiconductor substrate on which the pattern was formed was heated at 80° C. for 1 hour, 300° C. for 1 hour, and then 600° C. for 1 hour, so that the patterned thin film of $LiNbO_3$ was completed.

Example 4 is based on ethoxide of niobium and ethoxide of lithium. However, the present invention is not limited to use these alkoxides. Each of the alkoxides can be substituted with methoxide, propoxide, butoxide, methoxyethoxide or ethoxyethoxide to similarly form a patterned thin film. In case of using propoxide, either 1-propoxide or 2-propoxide might be used. In case of using butoxide, any of 1-butoxide, 2-butoxide, isobutoxide and t-butoxide might be used.

Ethanol was used as solvent. However, other alcohol such as methoanol, propanol, butanol, methoxyethanol or ethoxyethanol can be used to similarly form a patterned thin film. In case of using propanol, either 1-propanol or 2-propanol might be used. In case of using butanol, any of 1-butanol, 2-butanol, isobutanol and t-butanol might be used.

In Example 4, the benzenediazonium salt was used as an acid-generating agent. However, an onium salt other than the used salt such as a diphenyliodonium salt or a triphenyl sulfonium salt, other nitrobenzyl ester or sulfonic ester, or the like can be used. The mixing ratio of the benzenediazonium salt was 5%. However, the mixing ratio might be within the range from 0.1 to 30%, although the ratio varies in dependence on an used acid generating agent.

In Example 4, far ultraviolet rays were used for exposure to form a pattern. Instead of far ultraviolet rays, electron beams, laser beams, X-rays and the like can be used.

The above-mentioned conditions of heat treatment, mixing ratio, etchant and the like are merely concrete examples and they are not limited to such ones.

In Example 4, the composite oxide thin film of lithium and niobium was formed as an example. However, at least one alkoxide of metal such as tantalum, manganese or iron might be mixed instead of, or together with an alkoxide of niobiun. Thereby a composite oxide thin film of these metals can be formed, and characteristic of the obtained film can be changed.

These composite oxide thin films containing lithium have excellent piezoelectricability and pyroelectricability, and can be utilized as a surface acoustic wave element, semiconductor integrated circuit element, pyroelectric element, an optical waveguide or the like. Since pattern formation by fine processing is simplified according to the present invention, applicable fields of the pattern thin films are further expanded.

EXAMPLE 5

In an atmosphere of dry nitrogen, 0.01 mol of methoxide of titanium, 0.01 mol of monoethanolamine which inhibits hydrolysis and polycondensation reaction, and 100 ml of methanol was mixed for 1 hour to prepare a mixture solution. Successively, as an acid-generating agent 5% benzenediazonium salt ($C_6H_5$—$N_2^+PF_6^-$) was added to the solution and mixed with stirring.

The resulting solution was applied by spin coating to a quartz substrate. Then, the substrate was treated to dry at 80° C. for 30 minutes. Successively, the substrate was irradiated with far ultraviolet rays through an aligner to draw a pattern.

The selectively exposed thin film on the quartz substrate is developed with an etchant to form a patterned thin film of titania. The etchant used here is one obtained by diluting conc. hydrogen fluoride with a 20-fold amount of pure water.

The quartz substrate on which the patterned film was formed was dried at 80° C. for 1 hour, and then heated at 650° C. for 1 hour to remove remining organic substance, so that the firm patterned thin film of titania was completed.

Example 5 is based on methoxide of titanium. However, the present invention is not limited to use the alkoxide. The alkoxide can be substituted with ethoxide, propoxide, butoxide, methoxyethoxide or ethoxyethoxide to similarly form a patterned thin film. In case of using propoxide, either 1-propoxide or 2-propoxide might be used. In case of using butoxide, any of 1-butoxide, 2-butoxide, isobutoxide and t-butoxide might be used.

Methanol was used as solvent. However, other alcohol such as ethanol, propanol, butanol, methoxyethanol or ethoxyethanol can be used to similarly form a patterned thin film. In case of using propanol, either 1-propanol or 2-propanol might be used. In case of using butanol, any of 1-butanol, 2-butanol, isobutanol and t-butanol might be used.

In Example 5, the benzenediazonium salt was used as an acid-generating agent. However, an onium salt other than the used salt, such as a diphenyliodonium salt or a triphenyl sulfonium salt, other nitrobenzyl ester or sulfonic ester, or the like can be used. The mixing ratio of the benzenediazonium salt was 5%. However, the mixing ratio might be within the range from 0.1 to 30%, although the ratio varies depending on an used acid-generating agent.

In Example 5, far ultraviolet rays were used for exposure to form a pattern. Instead of far ultraviolet rays, electron beams, laser beams, X-rays or the like can be used.

The above-mentioned conditions of heat treatment, mixing ratio, etchant and the like are merely concrete examples and they are not limited to such ones.

Thus formed titania thin film has high insulativity, and can be utilized as a protective film, a dielectric film, an electrical insulating film, high refractive index film and the like on a substrate. In these uses, value in use of the patterned thin film is greatly progressed because pattern formation of fine processing is simplified by the present invention.

As explained above, according to the present invention, a metal oxide thin film is formed by sol-gel method, and thereto is mixed an acid-generating agent which generates an acid under light, laser beams, electron beams, X-rays or the like, so that etching by irradiating can be applied to a precursor thin film not sintered. Thanks to this, a metal oxide thin film can be easily patterned with a fine processing.

As a result, a memory or the like, employing ferroelectrics, used in an intagrated circuit can be easily formed without badly influencing semiconductor elements. Thus, it can be utilized in recent VLSI and electronic parts highly integrated. This greatly contributes to further miniaturization and high performancization of electronics.

According to the present invention, with finely processing there can be easily patterned a $BaTiO_3$ film used as a piezoelectric material, a ferroelectric film used for storage cells, an ITO film used as a film electrode, a composite oxide film containing lithium having good pyroelectric effect, a titania film, a superconducting film or the like. This significantly influences the field of electronics.

According to the present invention, for forming a pattern it can get off with only irradiating laser beams or the like through an aligner, and a conventional patterning of a resist is not required. This brings a reduced number of steps and a lowered cost, so that electronic parts can be economically produced.

According to the present invention, etching can be performed with a weak etchant. Thanks to this, a neighbor material to the etched portion is not damaged unlike in conventional dry etching, or a resist is not damaged by strong acid or strong alkali unlike in conventional wet etching. Thus, there are advantages that steps and operation are simplified and high quality products can be realized.

What is claimed is:

1. A method for patterning a metal oxide thin film comprising the steps of:
   (1) preparing a mixture comprising
      (a) at least one member selected from alkoxide of an element selected from the following Group A and alkoxyalcoholate of an element selected from the following Group A, and
      (b) at least one member selected from alcohol selected from the following Group B and alkoxyalcohol selected from the following Group B:
      Group A: lithium, beryllium, boron, sodium, aluminum, potassium, calcium, scandium, titanium, vanadium, chromium, manganese, iron, cobalt, nickel, copper, zinc, gallium, germanium, arsenic, selenium, rubidium, strontium, zirconium, niobium, rhodium, palladium, cadmium, indium, tin, antimony, tellurium, cesium, barium, lanthanum, cerium, praseodymium, neodymium, europium, gadolinium, terbium, holmium, ytterbium, ruthenium, hafnium, tantalum, platinum, lead, bismuth, and thorium, Group B: methanol, ethanol, propanol, butanol, methoxyethanol, ethoxyethanol, propoxyethanol, and butoxyethanol;
   (2) mixing an acid-generating agent which generates an acid under light, laser beams, electron beams or X-rays with the mixture;
   (3) applying the mixture to a substrate to form a thin film and drying the thin film;
   (4) selectively irradiating the thin film formed on the substrate with light, laser beams, electron beams or X-rays to accelerate the gelation.
   (5) removing the non-irradiated thin film in the step (4) by etching; and
   (6) burning the remaining thin film in the step (5).

2. The method of claim 1 wherein the alkoxide or alkoxyalcoholate is one of those in the following Group C and the alcohol or alkoxyalcohol is one of those in the following Group D:
   Group C: titanium methoxide, titanium ethoxide, titanium propoxide, titanium butoxide, titanium methoxyethoxide, and titanium ethoxyethoxide,
   Group D: methanol, ethanol, propanol, butanol, methoxyethanol, and ethoxyethanol.

3. A method for patterning a barium titanate thin film comprising the steps of:
   (1) preparing a mixture comprising at least one compound selected from the following Group E, at least one compound selected from the following Group C, and at least one compound selected from the following Group D:
   Group E: barium methoxide, barium ethoxide, barium propoxide, barium butoxide, barium methoxyethoxide, and barium ethoxyethoxide,
   Group C: titanium methoxide, titanium ethoxide, titanium propoxide, titanium butoxide, titanium methoxyethoxide, and titanium ethoxyethoxide,
   Group D: methanol, ethanol, propanol, butanol, methoxyethanol, and ethoxyethanol;

(2) mixing an acid-generating agent which generates an acid under light, laser beams, electron beams or X-rays with the mixture;
(3) applying the mixture to a substrate to form a thin film and drying the thin film;
(4) selectively irradiating the thin film formed on the substrate with light, laser beams, electron beams or X-rays to accelerate the gelation;
(5) removing the non-irradiated thin film in the step (4) by etching; and
(6) burning the remaining thin film in the step (5).

4. A method for patterning a lead titanate thin film comprising the steps of:
(1) preparing a mixture comprising at least one compound selected from the following Group F, at least one compound selected from the following Group G, and at least one compound selected from the following Group D:
Group F: lead methoxide, lead ethoxide, lead propoxide, and lead butoxide,
Group G: titanium methoxide, titanium ethoxide, titanium propoxide, and titanium butoxide,
Group D: methanol, ethanol, propanol, butanol, methoxyethanol, and ethoxyethanol;
(2) mixing an acid-generating agent which generates an acid under light, laser beams, electron beams or X-rays with the mixture;
(3) applying the mixture to a substrate to form a thin film and drying the thin film;
(4) selectively irradiating the thin film formed on the substrate with light, laser beams, electron beams or X-rays to accelerate the gelation;
(5) removing the non-irradiated thin film in the step (4) by etching; and
(6) burning the remaining thin film in the step (5).

5. The method of claim 4 wherein the mixture prepared in the step (1) further comprises at least one member selected from alkoxide of an element selected from the following Group H and alkoxyalcoholate of an element selected from the following Group H: Group H: lanthanum, niobium, zirconium, iron, and manganese.

6. The method of claim 4 wherein the mixture prepared in the step (1) further comprises at least one compound selected from the following Group I:
Group I: zirconium methoxide, zirconium ethoxide, zirconium propoxide, and zirconium butoxide.

7. A method for patterning an ITO thin film comprising the steps of:
(1) preparing a mixture comprising at least one compound selected from the following Group J, at least one compound selected from the following Group K, and at least one compound selected from the following Group D;
Group J: indium methoxide, indium ethoxide, indium propoxide, indium butoxide, indium methoxyethoxide, and indium ethoxyethoxide,
Group K: tin methoxide, tin ethoxide, tin propoxide, tin butoxide, tin methoxyethoxide, and tin ethoxyethoxide,
Group D: methanol, ethanol, propanol, butanol, methoxyethanol, and ethoxyethanol;
(2) mixing an acid-generating agent which generates an acid under light, laser beams, electron beams or X-rays with the mixture;
(3) applying the mixture to a substrate to form a thin film and drying the thin film;
(4) selectively irradiating the thin film formed on the substrate with light laser beams, electron beams or X-rays to accelerate the gelation;
(5) removing the non-irradiated thin film in the step (4) by etching; and
(6) burning the remaining thin film in the step (5).

8. A method for patterning a lithium-containing composite oxide thin film comprising the steps of:
(1) preparing a mixture comprising at least one compound selected from the following Group L, at least one compound selected from the following Group M, and at least one compound selected from the following Group D:
Group L: niobium methoxide, niobium ethoxide, niobium propoxide, niobium butoxide, niobium methoxyethoxide, and niobium ethoxyethoxide,
Group M: lithium methoxide, lithium ethoxide, lithium propoxide, lithium butoxide, lithium methoxyethoxide, and lithium ethoxyethoxide,
Group D: methanol, ethanol, propanol, butanol, methoxyethanol, and ethoxyethanol;
(2) mixing an acid-generating agent which generates an acid under light, laser beams, electron beams or X-rays with the mixture;
(3) applying the mixture to a substrate to form a thin film and drying the thin film;
(4) selectively irradiating the thin film formed on the substrate with light, laser beams, electron beams or X-rays to accelerate the gelation;
(5) removing the non-irradiated thin film in the step (4) by etching; and
(6) burning the remaining thin film in the step (5).

9. A method for patterning a lithium-containing composite oxide thin film comprising the steps of:
(1) preparing a mixture comprises at least one alkoxide or alkoxyalcoholate of an element selected from the following Group N, at least one compound selected from the following Group M, and at least one compound selected from the following Group D;
Group N: niobium, tantalum, manganese, and iron
Group M: lithium methoxide, lithium ethoxide, lithium propoxide, lithium butoxide, lithium methoxyethoxide, and lithium ethoxyethoxide,
Group D: methanol, ethanol, propanol, butanol, methoxyethanol, and ethoxyethanol;
(2) mixing an acid-generating agent which generates an acid under light, laser beams, electron beams or X-rays with the mixture;
(3) applying the mixture to a substrate to form a thin film and drying the thin film;
(4) selectively irradiating the thin film formed on the substrate with light laser beams, electron beams or X-rays to accelerate the gelation;
(5) removing the non-irradiated thin film in the step (4) by etching; and
(6) burning the remaining thin film in the step (5).

* * * * *